(12) United States Patent
Jang et al.

(10) Patent No.: US 9,425,216 B2
(45) Date of Patent: Aug. 23, 2016

(54) THIN FILM TRANSISTOR SUBSTRATE HAVING METAL OXIDE SEMICONDUCTOR AND MANUFACTURING THE SAME

(71) Applicant: LG DISPLAY CO., LTD., Yeongdeungpo-gu, Seoul (KR)

(72) Inventors: Hun Jang, Paju-si (KR); Sul Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/310,888

(22) Filed: Jun. 20, 2014

(65) Prior Publication Data

US 2015/0001542 A1  Jan. 1, 2015

(30) Foreign Application Priority Data

Jun. 26, 2013 (KR) .................. 10-2013-0073965

(51) Int. Cl.
*H01L 27/12* (2006.01)

(52) U.S. Cl.
CPC ......... *H01L 27/1225* (2013.01); *H01L 27/124* (2013.01); *H01L 27/1288* (2013.01)

(58) Field of Classification Search
CPC ............ H01L 27/1225; H01L 27/124; H01L 27/1288
See application file for complete search history.

(56) References Cited

U.S. PATENT DOCUMENTS

| 2009/0108259 A1* | 4/2009 | Lin et al. ................. 257/59 |
| 2011/0062433 A1* | 3/2011 | Yamazaki ................ 257/43 |
| 2011/0062445 A1* | 3/2011 | Oh et al. ................. 257/59 |
| 2012/0241733 A1* | 9/2012 | Morooka ............ H01L 27/1225 257/43 |

\* cited by examiner

*Primary Examiner* — Zandra Smith
*Assistant Examiner* — Lauren R Bell
(74) *Attorney, Agent, or Firm* — Birch, Stewart, Kolasch & Birch, LLP

(57) ABSTRACT

The present disclosure relates to a thin film transistor substrate having a metal oxide semiconductor for the fringe field type flat panel displays and a method for manufacturing the same. The thin film transistor substrate having an oxide semiconductor layer can include a substrate including pixel region; a gate element formed on the substrate; a gate insulating layer covering the gate element; a channel layer on the gate insulating layer, a source area expanded form a first side of the channel layer, a drain area expanded from a second side of the channel layer, and a pixel electrode expanded from the drain area to the pixel region; an etch stopper formed on the channel layer; a data element formed on the etch stopper; and a common electrode formed on the passivation layer and within the pixel region.

5 Claims, 8 Drawing Sheets

THIN FILM TRANSISTOR SUBSTRATE HAVING METAL OXIDE SEMICONDUCTOR AND MANUFACTURING THE SAME

CROSS-REFERENCE TO RELATED APPLICATION

This application claims priority to Patent Application No. 10-2013-0073965 filed in Republic of Korea on Jun. 26, 2013, which is incorporated by reference herein in its entirety.

BACKGROUND OF THE INVENTION

1. Field of the Invention

The present disclosure relates to a thin film transistor (or "TFT") substrate having a metal oxide semiconductor for the fringe field type flat panel displays and a method for manufacturing the same. Especially, the present disclosure relates to a thin film transistor substrate for the flat panel display in which an oxide semiconductor material is used for an active layer, a source-drain electrode and a pixel electrode by simplifying the manufacturing mask process, and a manufacturing method the same.

2. Discussion of the Related Art

Nowadays, as the information society is developed, the requirements of displays for representing information are increasing. Accordingly, the various flat panel displays (or 'FPD') are developed for overcoming many drawbacks of the cathode ray tube (or 'CRT') such as heavy weight and bulk volume. The flat panel display devices include the liquid crystal display device (or 'LCD'), the field emission display (or 'FED'), the plasma display panel (or 'PDP'), the organic light emitting display device (or 'OLED') and the electrophoresis display device (or 'ED').

The display panel of a flat panel display may include a thin film transistor substrate having a thin film transistor allocated in each pixel region arrayed in a matrix manner. For example, the liquid crystal display device represents video data by controlling the light transitivity of the liquid crystal layer using the electric fields. According to the direction of the electric field, the LCD can be classified in the two major types; one is vertical electric field type and the other is the horizontal electric field type.

For the vertical electric field type LCD, a common electrode formed on an upper substrate and a pixel electrode formed on a lower substrate are facing with each other for forming an electric field of which direction is perpendicular to the substrate face. A twisted nematic (TN) liquid crystal layer disposed between the upper substrate and the lower substrate is driven by the vertical electric field. The vertical electric field type LCD has merit of higher aperture ratio, while it has demerit of narrower view angle about 90 degree.

For the horizontal electric field type LCD, a common electrode and a pixel electrode are formed on the same substrate in parallel. A liquid crystal layer disposed between an upper substrate and a lower substrate is driven in In-Plane-Switching (or 'IPS') mode by an electric field parallel to the substrate face. The horizontal electric field type LCD has a merit of wider view angle over 160 degrees and faster response speed than the vertical electric field type LCD. However, the horizontal electric field type LCD may have demerits such as low aperture ratio and transitivity ratio of the back light.

In the IPS mode LCD, for example, in order to form the in-plane electric field, the gap between the common electrode and the pixel electrode may be larger than the gap (or "Cell Gap") between the upper substrate and the lower substrate, and in order to get enough strength of the electric field, the common electrode and the pixel electrode may have a strip pattern having certain width. Between the pixel electrode and the common electrode of the IPS mode LCD, the electric field horizontal with the substrate is formed. However, just over the pixel electrode and the common electrode, there is no electric field. That is, the liquid crystal molecules disposed just over the pixel electrodes and the common electrodes are not driven but maintain the initial conditions (the initial alignment direction). As the liquid crystal molecules in the initial condition cannot control the light transitivity properly, the aperture ratio and the luminescence may be degraded.

For resolving these demerits of the IPS mode LCD, the fringe field switching (or 'FFS') type LCD driven by the fringe electric field has been proposed. The FFS type LCD comprises the common electrode and the pixel electrode with the insulating layer there-between, and the gap between the pixel electrode and the common electrode is set narrower than the gap between the upper substrate and the lower substrate. So that, a fringe electric field having a parabola shape is formed in the space between the common electrode and the pixel electrode as well over these electrodes. Therefore, most of all liquid crystal molecules disposed between the upper substrate and the lower substrate can be driven by this fringe field. As a result, it is possible to enhance the aperture ratio and the front luminescence.

For the fringe field type liquid crystal display, the common electrode and the pixel electrode are disposed closely each other or in an overlapped manner, so that a storage is formed between the common electrode and the pixel electrode. Therefore, the fringe field type liquid crystal display has a merit in that there is no extra space for forming the storage in the pixel region. However, when a large area display is formed in a fringe field type, the pixel region would be getting larger and the storage would be getting larger and larger. In that case, the thin film transistor should have also larger size for driving/charging the enlarged storage in a short time period.

To solve this problem, the thin film transistor having a metal oxide semiconductor material is applied because it has the high current control characteristics without enlarging the size of the thin film transistor. FIG. 1 is a plane view illustrating a thin film transistor substrate having an oxide semiconductor layer included in a fringe field type liquid crystal display according to the related art. FIG. 2 is a cross-sectional view illustrating the structure of the thin film transistor substrate of FIG. 1 by cutting along the line I-I' according to the related art.

The thin film transistor substrate having a metal oxide semiconductor layer shown in FIGS. 1 and 2 comprises a gate line GL and a data line DL crossing each other with a gate insulating layer GI therebetween on a lower substrate SUB, and a thin film transistor T formed at each crossing portion. By the crossing structure of the gate line GL and the data line DL, a pixel region is defined.

The thin film transistor T comprises a gate electrode G branched (or 'extruded') from the gate line GL, a source electrode S branched from the data line DL, a drain electrode D facing the source electrode S and connecting to the pixel electrode PXL, and a semiconductor layer A overlapping with the gate electrode G on the gate insulating layer GI for forming a channel between the source electrode S and the drain electrode D.

The semiconductor layer A made of the oxide semiconductor material has a merit for a large area thin film transistor substrate having a large charging capacitance, thanks to the high electron mobility of the oxide semiconductor layer. However, the thin film transistor having the oxide semiconductor material would have an etch stopper ES for protecting the upper surface of the semiconductor layer from the etching material for ensuring the stability and the characteristics of the thin film transistor. More detail, it is proper to have an etch stopper ES for protecting the semiconductor layer A from the etchant used for forming the source electrode S and the drain electrode D there-between.

At one end of the gate line GL, a gate pad GP is formed for receiving the gate signal. The gate pad GP is connected to a gate pad intermediate terminal IGT through the first gate pad contact hole GH1 penetrating the gate insulating layer GI. The gate pad intermediate terminal IGT is connected to the gate pad terminal GPT through the second gate pad contact hole GH2 penetrating the first passivation layer PA1 and the second passivation layer PA2. Further, at one end of the data line DL, a data pad DP is formed for receiving the pixel signal. The data pad DP is connected to a data pad terminal DPT through the data pad contact hole DPH penetrating the first passivation layer PA1 and the second passivation layer PA2.

In the pixel region, a pixel electrode PXL and a common electrode COM are formed with the second passivation layer PA2 there-between, to form a fringe electric field. The common electrode COM is connected to the common line CL disposed in parallel with the gate line GL. The common electrode COM is supplied with a reference voltage (or "common voltage") via the common line CL.

The common electrode COM and the pixel electrode PXL can have various shapes and positions according to the design purpose and environment. While the common electrode COM is supplied with a reference voltage having constant value, the pixel electrode PXL is supplied with a data voltage varying timely according to the video data. Therefore, between the data line DL and the pixel electrode PXL, a parasitic capacitance may be formed. Due to the parasitic capacitance, the video quality of the display may be degraded. Therefore, it is preferable to form the common electrode COM at first and then the pixel electrode PXL is formed at the topmost layer.

In other words, on the first passivation layer PA1 covering the data line DL and the thin film transistor T, a planarization layer PAC formed by thickly depositing an organic material having a low permittivity. Then, the common electrode COM is formed. And then, after depositing the second passivation layer PA2 to cover the common electrode COM, the pixel electrode PXL overlapping with the common electrode is formed on the second passivation layer PA2. In this structure, the pixel electrode PXL is far from the data line DL by the first passivation layer PA1, the planarization layer PAC and the second passivation layer PA2, so that it is possible to reduce the parasitic capacitance between the data line DL and the pixel electrode PXL.

The common electrode COM is formed to a rectangular shape corresponding to the pixel region. The pixel electrode PXL is formed to have a plurality of segments. Especially, the pixel electrode PXL is vertically overlapped with the common electrode COM with the second passivation layer PA2 there-between. Between the pixel electrode PXL and the common electrode COM, the fringe electric field is formed. By this fringe electric field, the liquid crystal molecules arrayed in plane direction between the thin film transistor substrate and the color filter substrate may be rotated according to the dielectric anisotropy of the liquid crystal molecules. According to the rotation degree of the liquid crystal molecules, the light transmittance ratio of the pixel region may be changed so as to represent desired gray scale.

Hereinafter, we will explain about the method for manufacturing a FFS type thin film transistor substrate having the oxide semiconductor according to the related art. FIGS. 3A to 3I are cross-sectional views along to the cutting line I-I' in FIG. 1 for illustrating the manufacturing processes of the fringe field type thin film transistor according to the related art.

As shown in FIG. 3A, on a transparent lower substrate SUB, a gate metal is deposited. Patterning the gate metal using the first mask process, the gate elements are formed. The gate elements include a gate line GL, a gate electrode G branched out from the gate line GL, and a gate pad GP formed at one end of the gate line GL.

As shown in FIG. 3B, on the whole surface of the substrate SUB having the gate elements, a gate insulating layer GI is deposited. And then, an oxide semiconductor material is sequentially deposited. Patterning the oxide semiconductor material using the second mask process, a semiconductor layer A is formed.

As shown in FIG. 3C, on the whole surface of the substrate SUB having the semiconductor layer A, an insulating material such as a silicon nitride (SiNx) or a silicon oxide (SiOx) is deposited. Patterning the insulating material using the third mask process, an etch stopper ES is formed. It is preferable that the etch stopper ES is positioned on the middle portion of the semiconductor layer A overlapped with the gate electrode G.

As shown in FIG. 3D, using the fourth mask process, the gate insulating layer GI deposited at the topmost layer of the substrate SUB having the etch stopper ES is patterned to form the first gate pad contact hole GH1 exposing all or some portions of the gate pad GP.

On the substrate SUB having the semiconductor A and the etch stopper ES, a source-drain metal is deposited. Patterning the source-drain metal using the fifth mask process, the source-drain elements are formed. The source-drain elements include a data line DL crossing with the gate line GL, a gate pad intermediate terminal IGT connecting to the gate pad GP through the first gate pad contact hole GH1, a data pad DP formed at one end of the data line DL, a source electrode S branching out from the data line and connecting to one side of the semiconductor layer A, and a drain electrode D facing to the source electrode S with a predetermined distance and connecting to the other side of the semiconductor layer A. Especially, the source electrode S and the drain electrode D are physically disconnected each other, but they are linked through the semiconductor layer A.

In the case that etch stopper ES is not included, during patterning the source electrode S and the drain electrode D, the middle portions of the semiconductor layer A between the source electrode S and the drain electrode D may be etched by the etchant, so called 'Back Etch'. When the semiconductor layer A is made of the amorphous semiconductor, the Back Etch may not cause a big problem to the element characteristics. However, when the semiconductor layer A is made of the oxide semiconductor material, the Back Etch may cause a severe problem to the element characteristics and/or stability. Therefore, when the channel layer of the thin film transistor includes the oxide semiconductor material, it is preferable that the etch stopper ES is formed to protect the channel layer, as shown in FIG. 3E.

As shown in FIG. 3F, on the whole surface of the substrate SUB having the thin film transistor T, the first passivation layer PA1 is deposited. Then, using an organic material having a lower permittivity, a planarization layer PAC is deposited. Patterning the planarization layer PAC using the sixth mask process, the first drain contact hole DH1 is formed. The first drain contact hole DH1 does not expose the drain electrode D at all in this stage. The second passivation layer PA2 which will be formed later has the second drain contact hole DH2 exposing the drain electrode D. As the planarization layer PAC is relatively thick than any other layers, in order to make easy to form the second drain contact hole DH2 and to ensure the enough contact area of the exposed portions of the drain electrode D, the first drain contact hole DH1 is formed in advance. Further, on the gate pad GP and the data pad DP, removing some portions of the planarization layer PAC, some portions of the first passivation layer PA1 are exposed.

As shown in FIG. 3G, on the whole surface of the substrate SUB having the planarization layer PAC, a transparent conductive material such as an indium tin oxide (or 'ITO'). Patterning the transparent conductive layer using the seventh mask process, a common electrode COM is formed. The common electrode COM may have a rectangular shape corresponding to the shape and area of the pixel region.

As shown in FIG. 3H, on the whole surface of the substrate SUB having the common electrode COM, the second passivation layer PA2 is deposited. Patterning the first and the second passivation layers PA1 and PA2 using the eighth mask process, the second gate pad contact hole GH2 exposing the gate pad intermediate terminal IGT, the data pad contact hole DPH exposing some portions of the data pad DP, and the second drain contact hole DH2 exposing the drain electrode D are formed.

As shown in FIG. 3I, on the second passivation layer PA2, another transparent conductive material such as ITO is deposited. Patterning the transparent conductive material using the ninth mask process, a pixel electrode PXL, a gate pad terminal GPT and the data pad terminal DPT are formed. The pixel electrode PXL is overlapped with the common electrode COM on the second passivation layer PA2. Especially, the pixel electrode PXL has a plurality of segments disposed in parallel each other with a predetermined distance. The gate pad terminal GPT connects to the gate pad intermediate terminal IGT exposed through the second gate pad contact hole GH2. The data pad terminal connects to the data pad DP exposed through the data pad contact hole DPH.

After that, even though it is not shown in figures, the thin film transistor substrate having the pixel electrode PXL and the common electrode COM is sent to a chamber for forming an alignment layer. And then, depositing a liquid crystal layer and joining the color filter substrate, the liquid crystal display panel is formed.

Like this, according to the related arts, in order to manufacture the FFS type thin film transistor substrate for the flat panel display having the oxide semiconductor material, at least nine mask processes are required. As the number of the mask processes is increased, the manufacturing process is complicated, the possibility of problem may be increased and the cost would be expensive. Therefore, it is very important to reduce or simplify the manufacturing process for the thin film transistor substrate which has most elements of the liquid crystal display.

SUMMARY OF THE INVENTION

In order to overcome the above mentioned drawbacks, the purpose of the present disclosure is to suggest a method for manufacturing a thin film transistor substrate having an oxide semiconductor with less numbers of the mask processes and a thin film transistor substrate having an oxide semiconductor thereby. Another purpose of the present disclosure is to suggest a thin film transistor substrate in which the channel length is minimized for getting the ultra high density and/or the ultra high aperture ratio by defining the channel area in the active layer using the etch stopper as a mask, and a method for manufacturing the same.

In order to accomplish the above purpose, one embodiment of the present disclosure suggests a thin film transistor substrate having an oxide semiconductor layer comprising: a substrate including a plurality of pixel region; a gate element formed on the substrate; a gate insulating layer covering the gate element; a channel layer on the gate insulating layer, a source area expanded form a first side of the channel layer, a drain area expanded from a second side of the channel layer, and a pixel electrode expanded from the drain area to the pixel region; an etch stopper formed on the channel layer and having the same size with the channel layer; a data element formed on the etch stopper; a passivation layer covering the etch stopper and the data element; and a common electrode formed on the passivation layer and within the pixel region.

In some embodiments, the gate element includes: a gate line running to a horizontal direction of the substrate; a gate electrode branched to the pixel area from the gate line; and a gate pad disposed at one end of the gate line, wherein the data element includes: a data line running to a vertical direction of the substrate on the etch stopper; and a data pad disposed at one end of the data line, and wherein the thin film transistor substrate further comprises: a source electrode connecting the source area to the data line.

In some embodiments, the data element further includes a common connecting line formed on the etch stopper and having the same shape with the channel layer, and wherein the common connecting line is connected to the common electrode.

In some embodiments, the common connecting line is formed as to cross the gate line on the etch stopper and to connect a plurality of common electrodes arrayed in vertical direction.

Further, one embodiment of the present disclosure suggests a method for manufacturing a thin film transistor substrate comprising: a first mask process for forming a gate element with a gate metal material on a substrate; a second mask process for forming a source area, a drain area, a channel layer, a pixel electrode and a data element by sequentially depositing a gate insulating layer, an oxide semiconductor material, an etch stopper material and a data metal material on the gate element and patterning; a third mask process for exposing some portions of the source area and the data element by depositing a passivation layer on the substrate having the data element and patterning; and a fourth mask process for forming a source electrode connecting the source area to the data element and a common electrode overlapping with the pixel electrode having the passivation layer there-between by depositing a transparent conductive material on the passivation layer and patterning.

In some embodiments, the second mask process further comprises steps for: forming an etch stopper overlapping with a middle portion of the gate electrode, a data line crossing the gate line, and a semiconductor layer expanding from an under the data line through an under the etch stopper to the pixel region, by patterning the oxide semiconductor material, the etch stopper material and the data metal material with a half-tone mask; and defining the source area, the drain area, the pixel electrode and the channel layer by plasma treatment using the data element and the etch stopper as a mask.

In some embodiments, the second mask process further includes forming a common connecting line crossing the gate line and having the same size with the etch stopper on the etch stopper overlapping with the channel layer; wherein the third mask process further includes forming a common contact hole for exposing some portions of the common connecting line penetrating the passivation layer; and wherein, in the fourth mask process, the common electrode is connected to the common connecting line through the common contact hole.

According to the present disclosure, the thin film transistor substrate having the oxide semiconductor material can be manufactured with the 4 mask processes which are much less than the related art. Therefore, the manufacturing process can be simplified and the manufacturing cost can be saved. The thin film transistor substrate having the oxide semiconductor material according to the present disclosure has the channel layer of the semiconductor layer which is defined by the etch stopper. Therefore, it is possible to define the channel length no considering the mask align margin. As a result, the thin film transistor can be made in the minimized size. Further, the integration degree of the thin film transistors can be enhanced. An ultra high aperture flat panel display substrate having enlarged pixel region can be provided.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
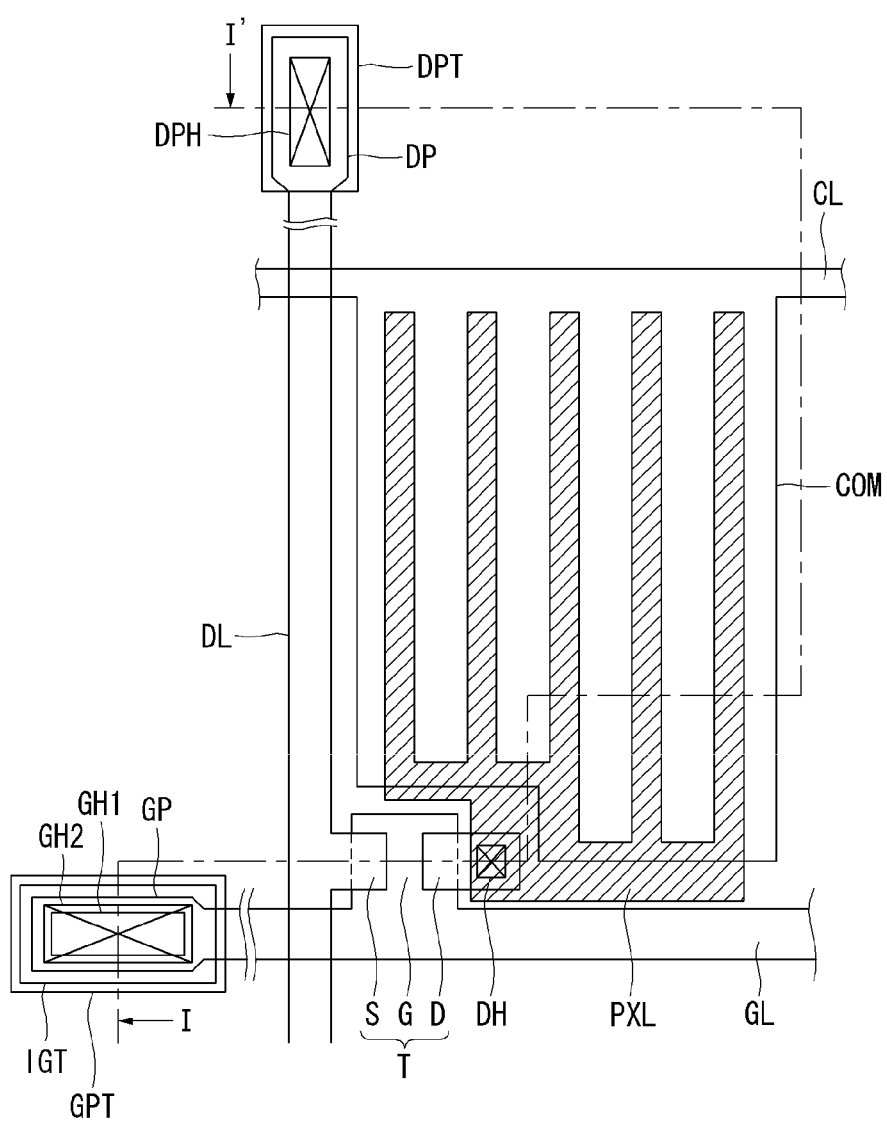
FIG. 1 is a plane view illustrating a thin film transistor substrate having an oxide semiconductor layer included in a fringe field type liquid crystal display according to the related art.
Figure 2:
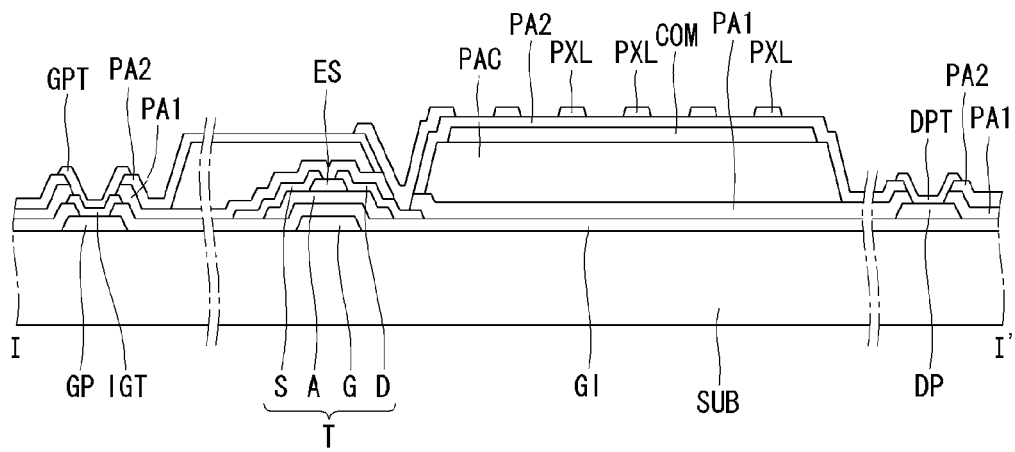
FIG. 2 is a cross-sectional view illustrating the structure of the thin film transistor substrate of FIG. 1 along the line I-I' according to the related art.
Figure 3A:
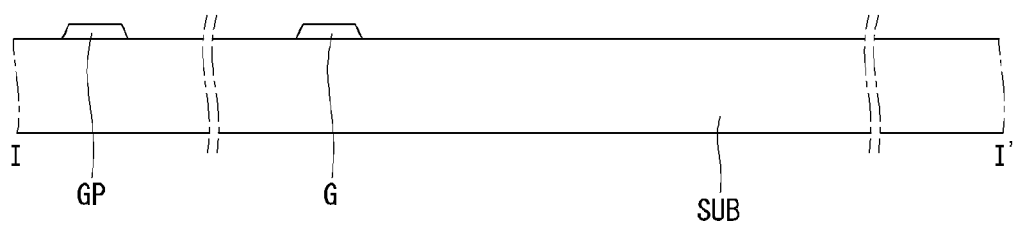
FIGS. 3A to 3I are cross-sectional views along to the cutting line I-I' in FIG. 1 for illustrating the manufacturing processes of the fringe field type thin film transistor according to the related art.
Figure 3B:
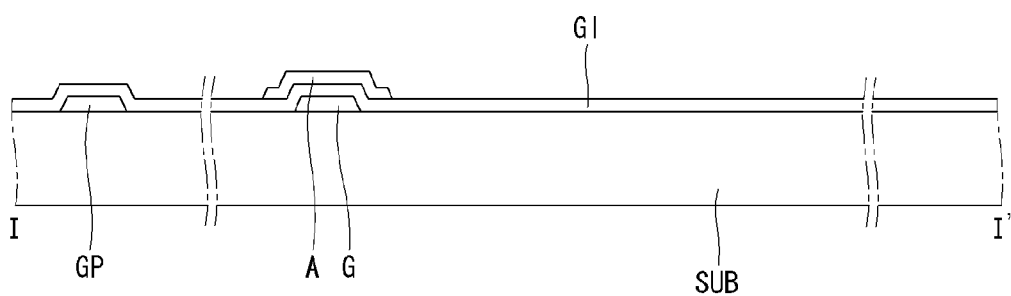
Figure 3C:
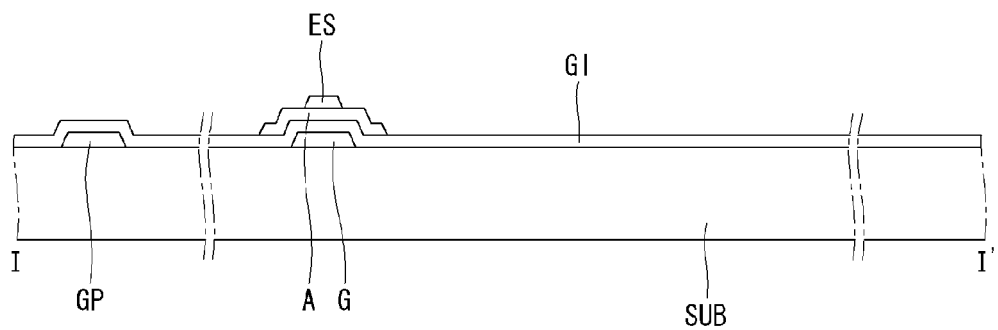
Figure 3D:
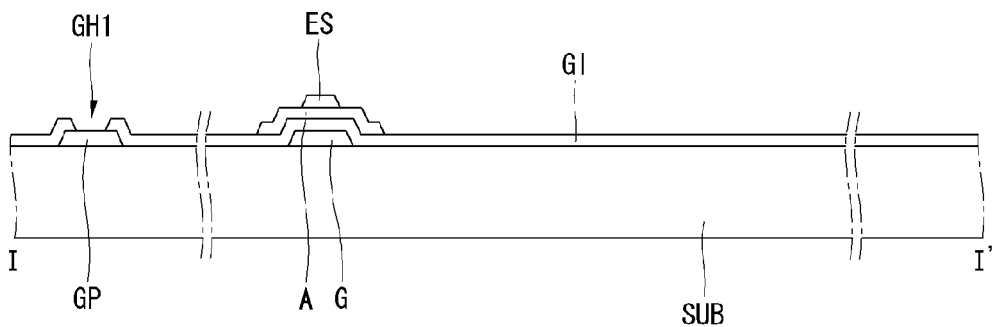
Figure 3E:
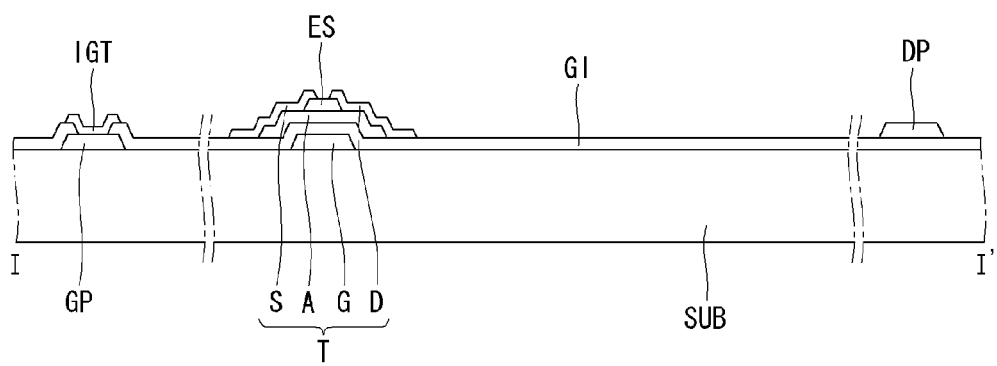
Figure 3F:
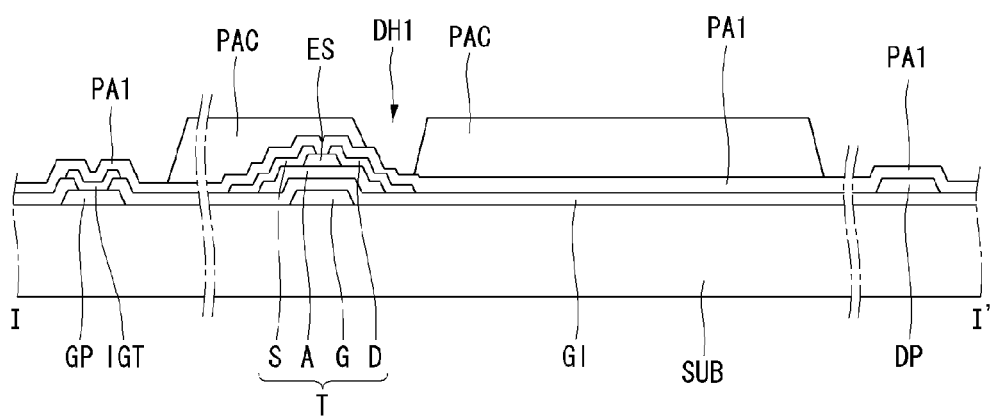
Figure 3G:
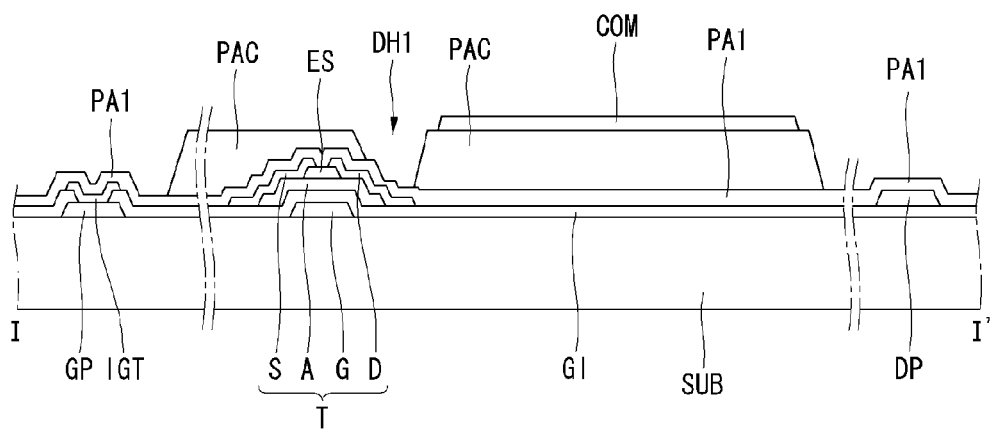
Figure 3H:
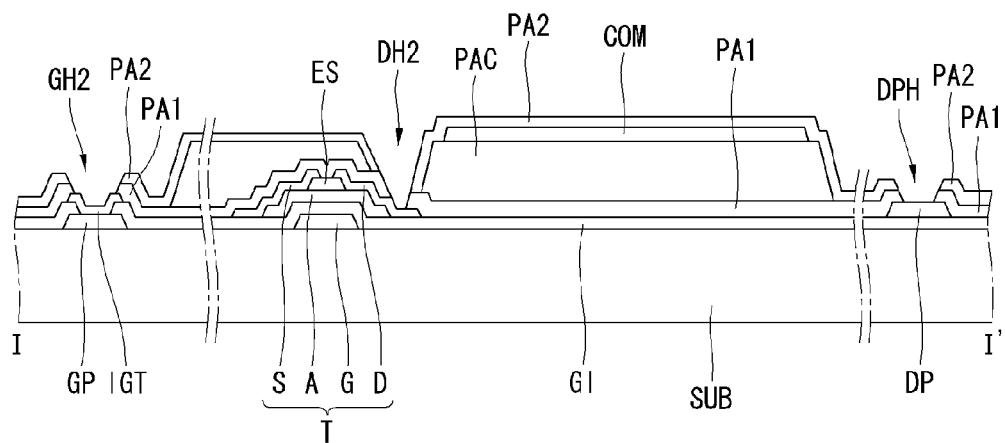
Figure 3I:
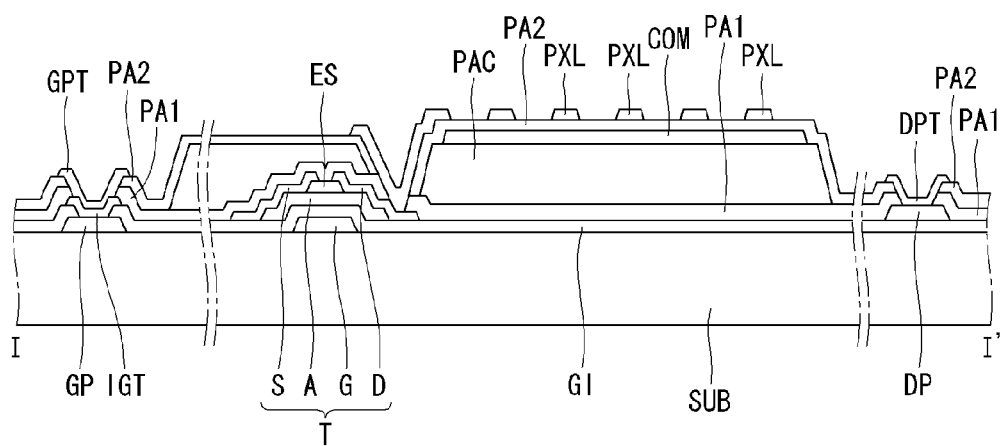

Referring to attached figures, preferred embodiments of the present invention will be described. Like reference numerals designate like elements throughout the detailed description. However, the present disclosure is not restricted by these embodiments but can be applied to various changes or modifications without changing the technical spirit. In the following embodiments, the names of the elements are selected for ease of explanation and may be different from actual names.

Figure 4:
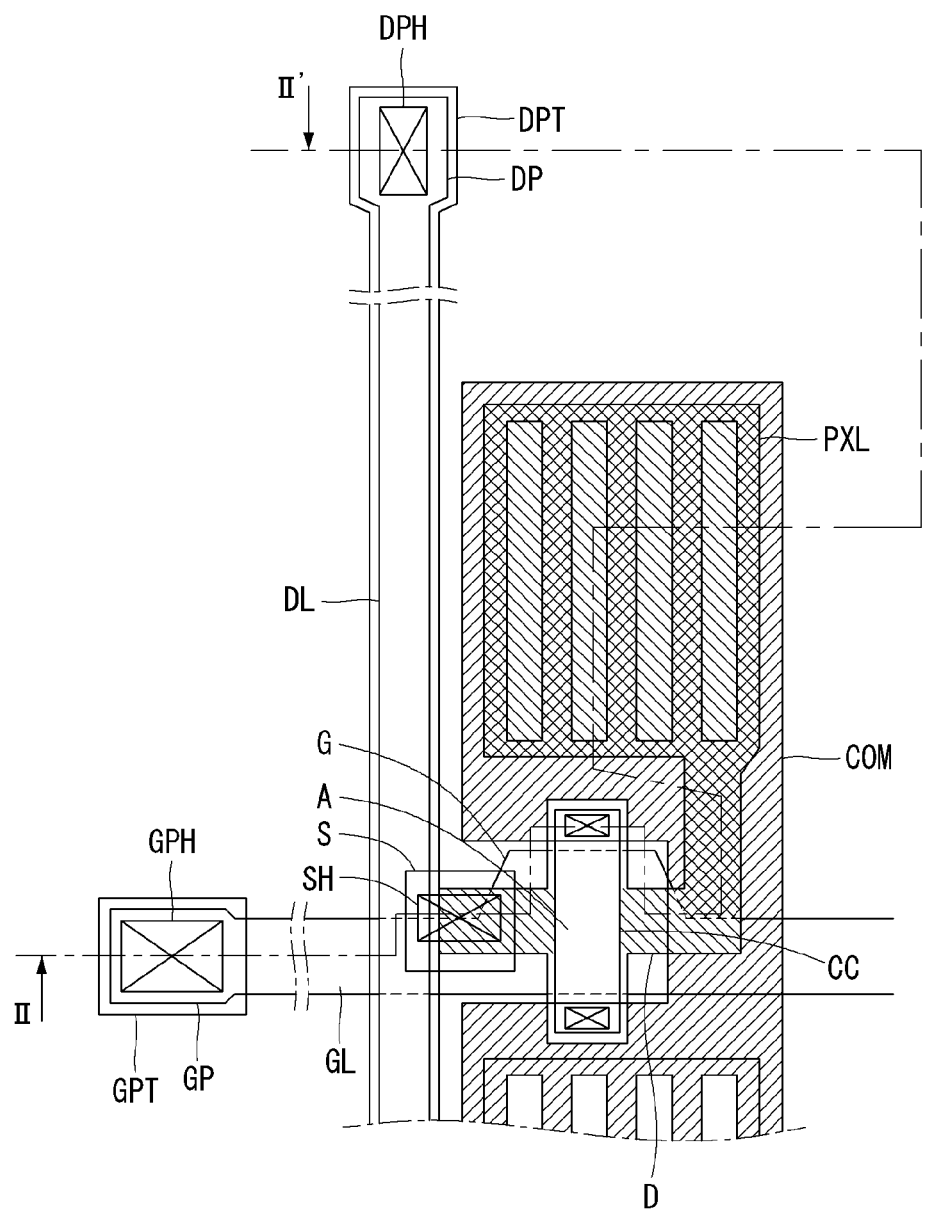
FIG. 4 is a plane view illustrating a thin film transistor substrate having an oxide semiconductor layer included in a fringe field type liquid crystal display according to an embodiment of the present invention.

Referring to FIGS. 4 and 5A to 5D, we will explain about the preferred embodiment of the present disclosure. FIG. 4 is a plane view illustrating a thin film transistor substrate having an oxide semiconductor layer included in a fringe field type liquid crystal display according to the present disclosure. FIGS. 5A to 5D cross-sectional views along to the cutting line II-II' in FIG. 4 for illustrating the manufacturing processes of the fringe field type thin film transistor according to the present disclosure.

Figure 5A:
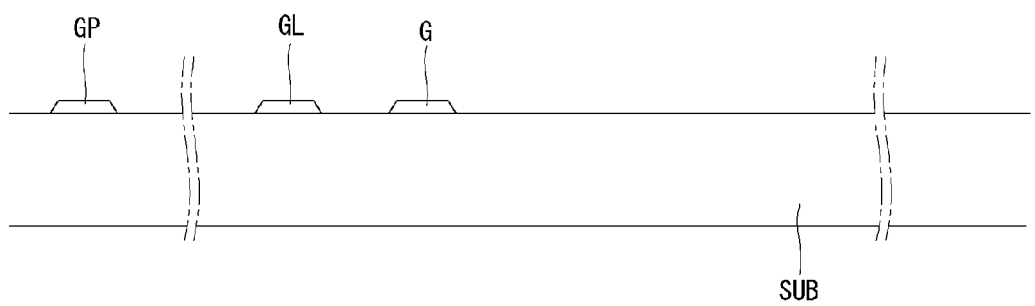
FIGS. 5A to 5D cross-sectional views along to the cutting line II-II' in FIG. 4 for illustrating the manufacturing processes of the fringe field type thin film transistor according to an embodiment of the present invention.
Figure 5B:
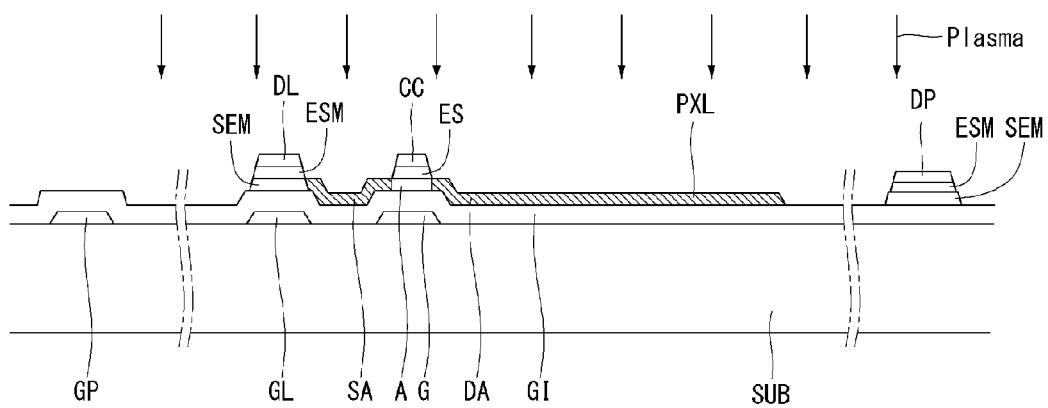
Figure 5C:
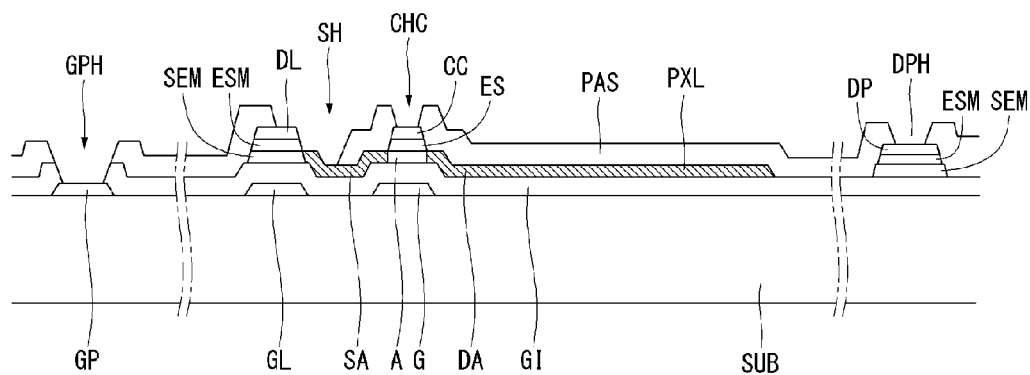
Figure 5D:
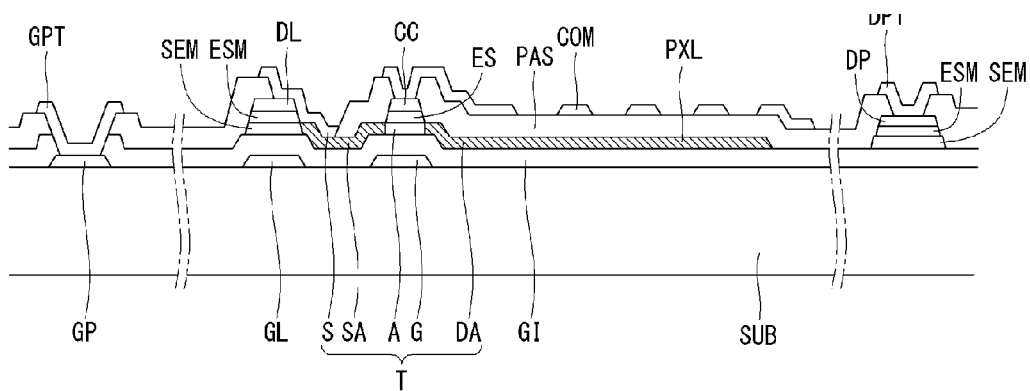

Referring to FIGS. 4 and 5D, the thin film transistor substrate having an oxide semiconductor layer according to the present disclosure comprises a gate line GL and a data line DL crossing each other with a gate insulating layer GI there-between on a lower substrate SUB, and a thin film transistor T formed each pixel region defined by the crossing structure of the gate line GL and the data line DL.

The thin film transistor T comprises a gate electrode G branching out from the gate line GL, a source electrode S connected to the data line DL, a drain area DA facing with the source electrode S, and a channel layer A overlapping with the gate electrode G on the gate insulating layer GI and forming an electron channel between the source electrode S and the drain area DA. According to the present disclosure, by implementing a conductorization (or 'metallization') process such as a plasma treatment process to the oxide semiconductor layer with an etch stopper ES as a mask, the channel layer A between the source area SA and the drain area DA is defined.

The terms of 'conductorization' (or 'metallization') 'condutorized' (or 'metalized') and/or 'conductorizing' (or 'metalizing') mean to change the semi-conductive material or non-conductive material to the conductive material. In the present disclosure, the semiconductor layer comprises the metal oxide semiconductor material which has metal material but is in semi-conductive state. By the conductorization process to some selective portions, the treated portions of this metal oxide semiconductor material may become to a material having the metal material and being in the conductive state.

At one end of the gate line GL, a gate pad GP is formed for receiving the gate signals. The gate pad GP connects to a gate pad terminal GPT through a gate contact hole GPH penetrating the gate insulating layer GI and the passivation layer PAS. Further, at one end of the data line DL, a data pad DP is formed for receiving the pixel signals (or 'video signals'). The data pad DP connects to a data pad terminal (DPT) through a data pad contact hole DPH penetrating the passivation layer PAS.

Within the pixel region, a pixel electrode PXL is formed as the drain area DA is expanded and/or extended. In detail, the pixel electrode PXL is formed in the pixel region when the semiconductor layer is patterned. When implementing the conductorization process for defining the drain area DA, the pixel electrode PXL is completed by the conductorization process.

Further, in the pixel region, a common electrode COM is formed on the passivation layer PAS. The common electrode COM may be formed as covering most area of the substrate except some portions for the thin film transistor T. According to the present disclosure, when the common electrode COM is formed, the source electrode S is formed for connecting the data line DL to the source area SA. As the source electrode S is physically and/or electrically disconnected from the common electrode COM, it is preferable that the common electrode COM covers most area of the substrate except the area for the thin film transistor T. At the area for the pixel electrode PIXL, the common electrode COM may be patterned to have a plurality of silts for forming the fringe electric field between the pixel electrode PXL and the common electrode COM, The common electrode COM is supplied with a reference voltage (or 'common voltage') for driving the liquid crystal molecules via a common line (not shown).

The common electrode COM and the pixel electrode PXL can have various shapes and positions according to the design purpose and environment. While the common electrode COM is supplied with a reference voltage having constant value, the pixel electrode PXL is supplied with a data voltage varying timely according to the video data. Therefore, between the data line DL and the pixel electrode PXL, a parasitic capacitance may be formed. In order to reduce the parasitic capacitance, the overlapped area between common electrode COM and the data line DL may be minimized For another method, the passivation layer PAS is made of an organic material having much lower permittivity such as the same material with the planarization layer. For still another method, an additional planarization layer is formed on the passivation layer PAS.

For yet another method, the common electrode COM is formed as an isolated shape within each unit pixel region, a common connecting line CC is formed on the etch stopper ES using the same material with the data line DL to connect the common electrodes COM arrayed in vertical direction. In this case, the common electrodes COM formed at each pixel column among the pixel regions arrayed in the matrix manner are electrically connected each other via the common connecting line CC formed as crossing the gate line GL on the etch stopper ES. And then, all of the common electrodes COM can be connected at the upper most side and/or the lower most side.

According to the present disclosure, the pixel electrode PXL has a rectangular shape corresponding to the shape of the pixel region. The common electrode COM is formed as a plurality of segments. Between the pixel electrode PXL and the common electrode COM, the fringe electric field is formed. By this fringe electric field, the liquid crystal molecules arrayed in plane direction between the thin film transistor substrate and the color filter substrate may be rotated according to the dielectric anisotropy of the liquid crystal molecules. According to the rotation degree of the liquid crystal molecules, the light transmittance ratio of the pixel region may be changed so as to represent desired gray scale.

Hereinafter, referring to FIGS. 5A to 5D, we will explain about a method for manufacturing a FFS type thin film transistor substrate having the oxide semiconductor according to present disclosure, and the features of the present disclosure, in detail.

As shown in FIG. 5A, on a transparent glass or plastic substrate SUB, a gate metal material is deposited. Patterning the gate metal material using a first mask process, a gate element is formed. The gate element includes a gate line GL running to horizontal direction on the substrate SUB, a gate electrode G branched out to the pixel region from the gate line GL, and a gate pad GP formed at one end of the gate line GL.

As shown in FIG. 5B, on the substrate SUB having the gate element, a gate insulating layer GI, an oxide semiconductor material, an insulating material and a data metal material are sequentially deposited. Simultaneously patterning the data metal material, the insulating material and the oxide semiconductor material using a second mask process, an etch stopper ES, a semiconductor layer and a data element are formed. Particularly, the etch stopper ES and the data element are patterned as the same shape, but the semiconductor layer is patterned in different shape. To do so, it is preferable to use a half-tone mask for the second mask process.

The data element includes a data line DL, crossing to the gate line GL with a gate insulating layer GI and the etch stopper ES there-between and a data pad DP formed at one end of the data line DL. It is preferable that the etch stopper ES is overlapped with the gate electrode G, and it has the same size with the channel layer A. As the data metal material and the insulating layer are formed as having the same shape, the data element and the etch stopper ES have the stacked structure. For example, on the etch stopper ES, a common connecting line CC having the same material with the data line DL is formed. The common connecting line CC may electrically connect the common electrodes COM arrayed in vertical ('or column') direction, when the common electrodes COM are formed as the isolated shape in each pixel region. In some cases, the common connecting line CC may be covered by the passivation layer PAS; in that case, the common connecting line CC is not used as a line but as a dummy pattern. Under the data line DL and the data pad DP, the etch stopper material ESM and the semiconductor material SEM may be remained as stacked.

In the interim, the oxide semiconductor material is formed as expanding from the under of the data line DL to the pixel region passing under the etch stopper ES. Using the etch stopper ES and the data element as a mask, a plasma treatment is implemented on the exposed surface of the oxide semiconductor material, so that the exposed oxide semiconductor material is conductorized. As a result, the exposed oxide semiconductor material between the data line DL and the etch stopper ES would be defined as the source area SA of the thin film transistor T. In the interim, the exposed oxide semiconductor material facing the source area SA from the etch stopper ES would be defined as the drain area DA and the pixel electrode PXL. In this structure the drain area DA and the pixel electrode PXL are not actually/precisely distinguished. That is, the pixel electrode PXL is formed by conductorizing the oxide semiconductor material expanded and/or extended from the drain area DA to the pixel region.

The oxide semiconductor material under the etch stopper ES is remained as not being conductorized, so that this area is defined as the channel layer A. In the present disclosure, the channel layer A can be defined exactly by the size of the etch stopper ES when the oxide semiconductor material is conductorized with the etch stopper ES as a mask. Therefore, the size of the channel layer A, especially the length of the channel layer A, can be defined very precisely because the channel layer A is not defined by any other additional mask. For example, in the case of the related arts that after forming the channel layer A and then the etch stopper A is formed on the channel layer A, the margins of all mask processes should be considered. So that, it is hard to control the width/length ratio of the channel layer A to keep less than 4/10. On the contrary, according to the present disclosure, as the length of the channel layer A is defined by the length of the etch stopper ES, it is possible to control the width/length ratio of the channel layer A to keep less than 4/5.

On the substrate SUB, a thin film transistor is completed, wherein the thin film transistor includes the gate electrode G branched out from the gate line GL, the channel layer A overlapped with the gate electrode G on the gate insulating layer GI, the source area SA connected to one side of the channel layer A and the drain area DA connected to the other side of the channel layer A. However, not yet, the source area SA of the thin film transistor T is not connected to the data line DL, as shown in FIG. 5B.

As shown in FIG. 5C, on the whole surface of the substrate SUB having the thin film transistor T, a passivation layer PAS is deposited. Patterning the passivation layer PAS and/or the gate insulating layer GI using a third mask process, contact holes are formed. The contact holes include a gate pad contact hole GPH exposing the gate pad GP through the passivation layer PAS and the gate insulating layer GI, a data pad contact hole DPH exposing the data pad DP through the passivation layer PAS, a source contact hole SH exposing some portions of the data line DL and some portions of the source area SA through the passivation layer PAS, and common electrode contact hole CHC exposing some portions of the common connecting line CC through the passivation layer PAS.

On the whole surface of the substrate SUB having the contact holes, a transparent conductive material is deposited. The transparent conductive material includes the indium thin oxide (or 'ITO') or the indium zinc oxide (or 'IZO'). Patterning the transparent conductive material using a fourth mask process, a source electrode S, a gate pad terminal GPT, a data pad terminal DPT, and a common electrode COM are formed.

The source electrode S connects the data line DL and the source area SA via the source contact hole SH. The thin film transistor T is connected to the gate line GL and the data line DL. The gate pad terminal GPT contacts to the gate pad exposed through the gate pad contact hole GPH. The data pad terminal DPT connects to the data pad DP exposed through the data pad contact hole DPH.

As shown in FIG. 5D, the common electrode COM may be formed within the pixel region and have a plurality of segments which are disposed in parallel each other with a predetermined distance. When the common electrode COM is formed within each unit pixel region, a plurality of common electrodes disposed in vertical array may be connected each other by connecting to the common connecting line CC exposed through the common electrode contact hole CHC. Alternatively, regardless of connection to the common connecting line CC, all of the common electrodes COM may be connected each other as one body by forming as covering each unit pixel region and the expanded area including the data line DL and the gate line GL.

According to the present invention, the data element and the etch stopper ES are formed at the same time (i.e., in the same mask process). Then, the channel layer A is defined using the etch stopper ES as a mask. As a result, the number of mask processes can be 4 processes. The manufacturing process can be simplified, the tact time can be shortened, and the manufacturing cost can be reduced.

Further, by the size of the etch stopper ES, the width/length ratio of the channel layer can be minimized So that, it is possible to make the thin film transistors in a minimized size. That is, the area portion of the thin film transistor to the pixel region can be reduced, so that the ultra high aperture ratio display can be designed and manufactured. Also, it is possible to design and manufacture an ultra high density display in which much more transistors can be disposed within the same display area.

According to the present invention, the data line DL, the etch stopper ES and the semiconductor layer are formed at the same time (i.e., in one mask process). Particularly, the data line DL and the etch stopper ES have the same shape (or 'profile'). Therefore, the etch stopper material ESM is remained under the data line DL as a residue, and the data metal material is remained over the etch stopper ES as a residue.

The residue of the data metal material can be used variously. As explained as one example in the present invention, it can be used as the common connecting line CC receiving and sending the common voltage. For another example, it may not be connected to the common electrode COM, but it may be connected to the gate electrode G and the gate line GL for building a double gate structure thin film transistor. For still another example, it may be an isolated residue for using as a light shielding layer. For yet still another example, if the residue causes any unexpected problem, it can be removed by an etching process used in forming the common electrode.

While the embodiments of the present invention have been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A method for manufacturing a thin film transistor substrate, the method comprising:
    a first mask process for forming a gate element with a gate metal material on a substrate; a second mask process for forming a source area, a drain area, a channel layer, a pixel electrode and a data element by sequentially depositing a gate insulating layer, an oxide semiconductor material, an etch stopper material and a data metal material on the gate element and patterning;
    a third mask process for exposing some portions of the source area and the data element by depositing a passivation layer on the substrate having the data element and patterning; and
    a fourth mask process for forming a source electrode connecting the source area to the data element and a common electrode overlapping with the pixel electrode having the passivation layer there-between by depositing a transparent conductive material on the passivation layer and patterning,
    wherein the second mask process further comprises:
    forming an etch stopper overlapping with a middle portion of a gate electrode, a data line crossing a gate line, and a semiconductor layer expanding from under the data line through under the etch stopper to the pixel region, by patterning the oxide semiconductor material, the etch stopper material, and the data metal material with a half-tone mask; and
    forming the source area, the drain area, and the pixel electrode by selective plasma treatment of the oxide semiconductor material extended from the channel layer using the data element and the etch stopper as a mask.

2. The method according to claim 1, wherein the second mask process further includes forming a common connecting line crossing the gate line and having the same size with the etch stopper on the etch stopper overlapping with the channel layer;

wherein the third mask process further includes forming a common contact hole through the passivation layer for exposing some portions of the common connecting line; and wherein, in the fourth mask process, the common electrode is connected to the common connecting line through the common contact hole.

3. A method for manufacturing a thin film transistor substrate, the method comprising:

a first mask process for forming a gate element with a gate metal material on a substrate;

a second mask process for forming a thin film transistor, a pixel electrode and a data element by sequentially depositing a gate insulating layer, an oxide semiconductor material, an etch stopper material and a data metal material on the gate element and patterning;

a third mask process for exposing some portions of a source area of the thin film transistor and the data element by depositing a passivation layer on the substrate having the data element and patterning; and a fourth mask process for forming a source electrode connecting the source area to the data element and a common electrode overlapping with the pixel electrode having the passivation layer there-between by depositing a transparent conductive material on the passivation layer and patterning, wherein the second mask process further includes:

forming an etch stopper overlapping with a middle portion of a gate electrode of the gate element, a data line crossing a gate line of the gate element, and a semiconductor layer expanding from under the data line through under the etch stopper to a pixel area by patterning the oxide semiconductor material, the etch stopper material and the data metal material with a half-tone mask; and forming the source area and a drain area of the thin film transistor, and the pixel electrode by selective plasma treatment of the oxide semiconductor material extended from a channel layer of the thin film transistor using the data element and the etch stopper as a mask.

4. The method according to the claim 3, wherein the gate element formed by the first mask process includes:

the gate line running to a horizontal direction of the substrate;

the gate electrode branched to the pixel area from the gate line; and a gate pad disposed at one end of the gate line.

5. The method according to the claim 4, wherein the second mask process further includes forming a common connecting line crossing the gate line and having the same size with the etch stopper on the etch stopper overlapping with the channel layer;

wherein the third mask process further includes forming a common contact hole through the passivation layer for exposing some portions of the common connecting line; and wherein, in the fourth mask process, the common electrode is connected to the common connecting line through the common contact hole.

\* \* \* \* \*